United States Patent [19]
Jandu

[11] Patent Number: 5,619,156
[45] Date of Patent: Apr. 8, 1997

[54] LOW VOLTAGE INHIBIT CIRCUIT AND INTEGRATED CIRCUIT USING SAME

[75] Inventor: Jaswinder S. Jandu, Austin, Tex.

[73] Assignee: Motorola, Inc., Schaumburg, Ill.

[21] Appl. No.: 520,450

[22] Filed: Aug. 29, 1995

[51] Int. Cl.⁶ .......................... H03K 17/22; H03K 17/30; H02H 3/24
[52] U.S. Cl. .......................... 327/198; 327/206; 327/539; 327/544
[58] Field of Search .............................. 327/76, 198, 205, 327/206, 74, 544, 539, 538

[56] References Cited

U.S. PATENT DOCUMENTS

| | | | |
|---|---|---|---|
| 4,296,338 | 3/1988 | Thomas | 327/88 |
| 4,764,839 | 8/1988 | Laud | 327/143 |
| 4,902,910 | 2/1990 | Hsieh | 327/198 |
| 5,166,546 | 11/1992 | Savignac et al. | 327/198 |
| 5,199,032 | 3/1993 | Sparks et al. | 371/3 |

Primary Examiner—Timothy P. Callahan
Assistant Examiner—Terry L. Englund
Attorney, Agent, or Firm—Paul J. Polansky

[57] ABSTRACT

An integrated circuit (20) includes a low voltage inhibit (LVI) circuit (21) to protect an internal circuit (22) against losses in power supply voltage. The LVI circuit (21) includes primary (30) and secondary (35) LVI circuits. The primary LVI circuit (30) is a high-precision analog circuit which is selectively enabled when the secondary LVI circuit (35) senses that the power supply voltage is approaching a critical range. The primary LVI circuit (30) resets an internal circuit (22) of the integrated circuit (20) when it senses the power supply voltage falling below a critical level. Thus, the higher current primary LVI circuit (30) need only be enabled when a more precise power supply voltage measurement is required. The LVI circuit (21) also includes a disabling circuit (40) which latches an active output of the primary LVI circuit (30) and then disables the primary LVI circuit (30).

18 Claims, 3 Drawing Sheets

LOW VOLTAGE INHIBIT CIRCUIT AND INTEGRATED CIRCUIT USING SAME

FIELD OF THE INVENTION

This invention relates generally to electronic circuits, and more particularly, to electronic circuits which are subject to unexpected losses in power.

BACKGROUND OF THE INVENTION

Generally, it is desirable for monolithic circuits to be designed for minimum power consumption. The need for low power consumption is normally traded off with other factors such as integrated circuit cost and design time. However, recently integrated circuits are being used in a wide variety of products powered by batteries. In these products low power consumption is even more important because the higher the power consumption, the shorter the amount of time the products may be operated without replacing or recharging the battery.

Frequently, the circuits are in the form of microcontrollers. Microcontrollers are data processors having not only a central processing unit (CPU), but also other circuitry such as volatile and nonvolatile memory, timers, event counters, and input/output circuitry normally associated with computer systems. Microcontrollers may be affected by a drop in the power supply voltage. Not only will the microcontroller cease to function entirely when the power supply voltage falls too far, but they may also function incorrectly as the battery voltage falls, causing deleterious effects in the system.

In an effort to avoid this harmful operation, microcontroller designers have included circuitry to detect that the battery voltage has fallen to a critical level, and place the microcontroller into reset. These circuits are variously known as low voltage inhibit (LVI) or low voltage reset (LVR) circuits. Typically, the LVI circuits are analog circuits based on a bandgap voltage reference. A comparator detects when a fraction of the battery voltage drops below the bandgap voltage and takes some action in response, such as activating a reset signal to reset the microcontroller.

One difficulty faced by integrated circuit designers is that because the LVI circuit is an analog circuit, it consumes a significant amount of power itself, and it contributes to battery drain. Known techniques for reducing the LVI circuit's power consumption, furthermore, require an increase in integrated circuit area. What is needed, then is a low voltage inhibit circuit which is compact in terms of circuit area, and which has a minimum of current drain so as not to reduce battery life even further. Such a low voltage inhibit circuit and an integrated circuit using it are provided by the present invention, whose features and advantages will be more clearly understood from the following detailed description taken in conjunction with the accompanying drawings.

DETAILED DESCRIPTION OF A PREFERRED EMBODIMENT

Figure 1:
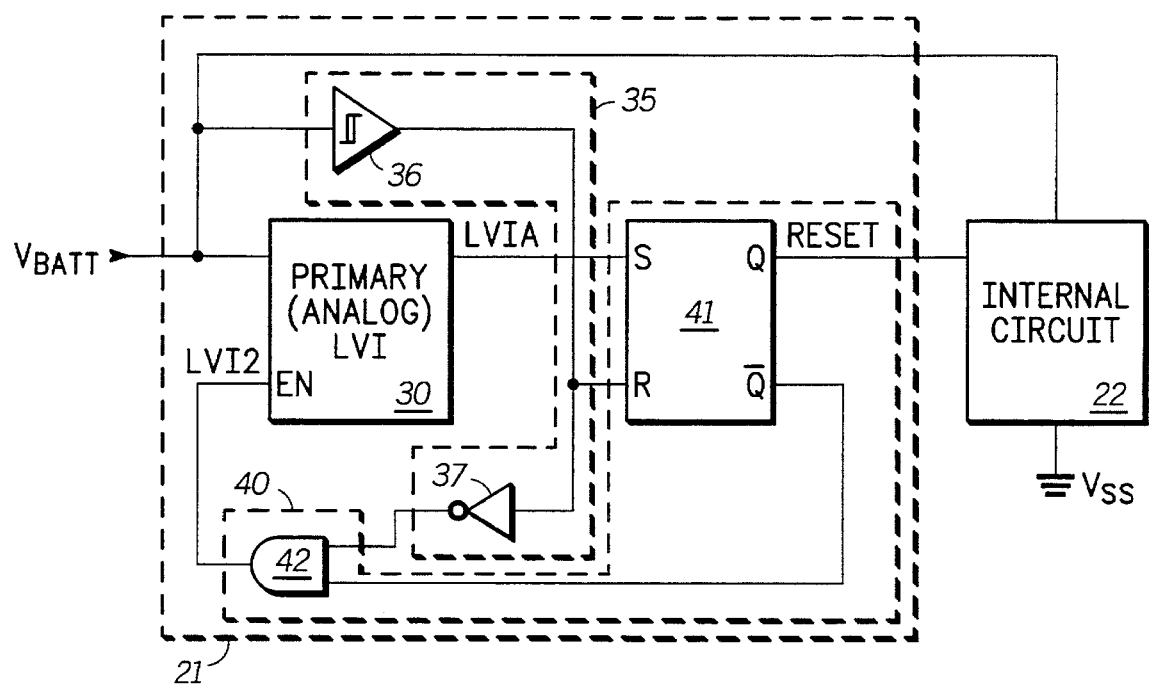
FIG. 1 illustrates in partial block, partial logic, and partial schematic form an integrated circuit with a low voltage inhibit (LVI) circuit according to the present invention.

FIG. 1 illustrates in partial block, partial logic, and partial schematic form an integrated circuit 20 with a low voltage inhibit (LVI) circuit 21 according to the present invention. Integrated circuit 20 also includes an internal circuit 22 which is connected between a more positive power supply voltage terminal supplied from a battery, not shown, labelled "$V_{BATT}$" and a ground power supply voltage terminal labelled "VSS". $V_{BATT}$ has a particular nominal voltage but as the battery nears the end of its life, $V_{BATT}$ compresses and eventually falls below a point at which internal circuit 22 can no longer function properly. In the illustrated embodiment, $V_{BATT}$ has a nominal voltage of three volts, and internal circuit 22 is capable of proper operation until $V_{BATT}$ falls below 1.8 volts. However, it should be apparent that these voltages are merely illustrative and will vary from embodiment to embodiment.

In the illustrated embodiment, internal circuit 22 is a microcontroller, and thus has both volatile and nonvolatile memory and peripheral circuits. The function of these circuits is well known in the art and it should be appreciated that LVI circuit 21 may be used with internal circuits other than microcontrollers.

LVI circuit 21 includes generally a primary LVI circuit 30, a secondary LVI circuit 35, and a disabling circuit 40. Primary LVI circuit 30 has a sense input terminal for receiving the battery voltage $V_{BATT}$, an enable input terminal for receiving a signal "LVI2", and an output terminal for providing a signal labelled "LVIA". Secondary LVI circuit 35 includes a Schmitt trigger 36 and an inverter 37. Schmitt trigger 36 has an input terminal for receiving $V_{BATT}$, and an output terminal. Inverter 37 has an input terminal coupled to the output terminal of Schmitt trigger 36, and an output terminal. Disabling circuit 40 includes an SR flip-flop 41 and an AND gate 42. Flip-flop 41 has a set input terminal labelled "S" connected to the output terminal of primary LVI circuit 20 for receiving signal LVIA, a reset input terminal labelled "R" connected to the output terminal of Schmitt trigger 36, a true output terminal labelled "Q" for providing a signal labelled "RESET" to internal circuit 22, and a complementary output terminal labelled "$\overline{Q}$". AND gate 42 has a first input terminal connected to the output terminal of inverter 37, a second input terminal connected to the $\overline{Q}$ output terminal of flip-flop 41, and an output terminal connected to the EN input terminal of analog LVI circuit 30 for providing signal LVI2.

LVI circuit 21 includes both a highly-accurate analog LVI circuit (primary LVI circuit 30), and less accurate but lower power LVI circuit (secondary LVI circuit 35). When the battery voltage is near its nominal value, secondary LVI circuit 35 keeps primary LVI circuit 30 disabled. Secondary LVI circuit 35 is able to detect a drop in $V_{BATT}$, although less accurately then primary LVI circuit 30. After detecting such a drop, secondary LVI circuit 35 activates signal LVI2, which enables primary LVI circuit 30, which may now more accurately track reductions in $V_{BATT}$ until at last $V_{BATT}$ falls below the critical voltage. At this point, primary LVI circuit 30 activates signal LVIA, which causes flip-flop 41 to be set and to activate signal RESET at its Q output terminal. At this point flip-flop 41 also deactivates signal $\overline{Q}$, causing the output of AND gate 42 to switch to a logic low, which inactivates primary LVI circuit 30.

LVI circuit 21 reduces power consumption in two important ways compared to known LVI circuits. First, when the battery is at or near its nominal voltage, only secondary LVI circuit 35 is enabled and power consumption is negligible. Second, after secondary LVI circuit 35 enables primary LVI circuit 30 and primary LVI circuit 30 detects a drop in battery voltage below the minimum threshold, disabling circuit 40 again disables primary LVI circuit 30 to prevent further power consumption.

Figure 2:
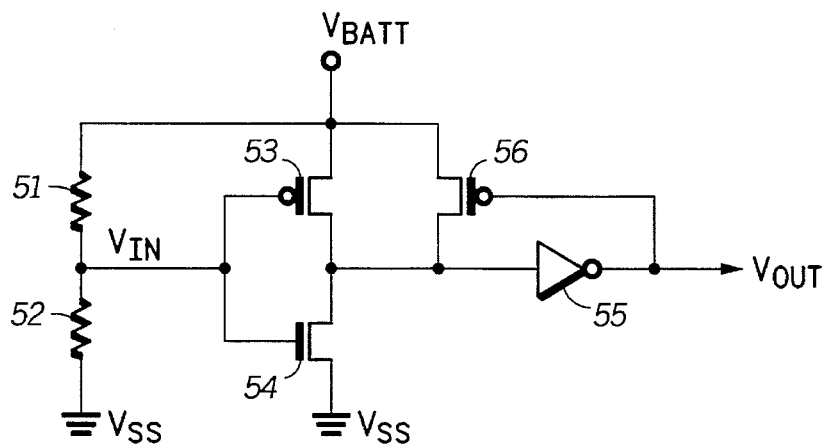
FIG. 2 illustrates in schematic form a first complementary metal-oxide-semiconductor (CMOS) Schmitt trigger suitable for use in the low voltage detection circuit of FIG. 1.

FIG. 2 illustrates in schematic form a first complementary metal-oxide-semiconductor (CMOS) Schmitt trigger 50 suitable for use in low voltage detection circuit of FIG. 1. Schmitt trigger 50 includes resistors 51 and 52 connected in series between $V_{BATT}$ and $V_{SS}$. The interconnection point forms a voltage labelled "$V_{IN}$" which is proportional to $V_{BATT}$ referenced to $V_{SS}$. This proportional voltage is provided to an input of a CMOS inverter formed with a P-channel transistor 53 and an N-channel transistor 54. Transistor 53 has a source connected to $V_{BATT}$, a gate for receiving signal $V_{IN}$, and a drain. Transistor 54 has a drain connected to the drain of transistor 53, a gate for receiving signal $V_{IN}$, and a source connected to $V_{SS}$. Schmitt trigger 50 also includes an inverter 55 and a P-channel transistor 56. Inverter 55 has an input terminal connected to the drains of transistors 53 and 54, and an output terminal. Transistor 56 has a source connected to $V_{BATT}$, a gate connected to the output terminal of inverter 55, and a drain connected to the input terminal of inverter 55. Schmitt trigger 50 scales $V_{BATT}$ to form proportional voltage $V_{IN}$ which causes the inverter formed by transistors 53 and 54 to switch when $V_{BATT}$ approaches a critical range which is above the final inhibit voltage. Resistors 51 and 52 are preferably high-valued to minimize steady-state (DC) current flow. The only other current flow occurs when the inverter switches.

Figure 3:
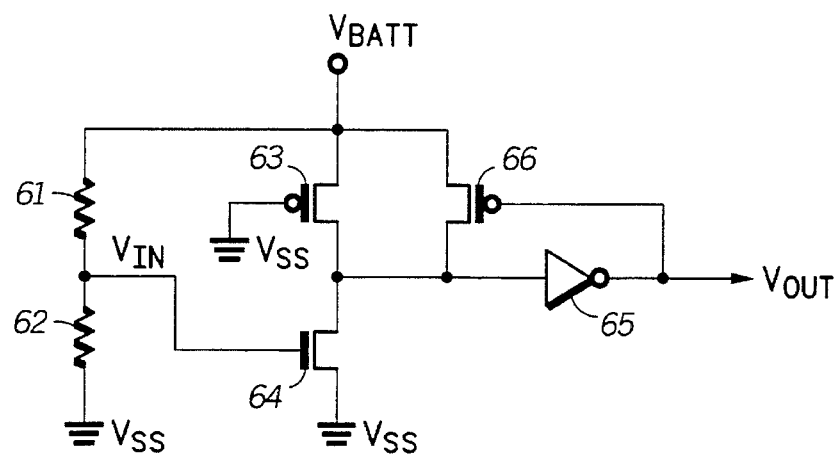
FIG. 3 illustrates in schematic form a second CMOS Schmitt trigger suitable for use in the low voltage detection circuit of FIG. 1.

Because of its extremely low power consumption, Schmitt trigger 50 is preferably used when the manufacturing process ensures adequate headroom when $V_{BATT}$ approaches the critical range. If this condition is not met, another Schmitt trigger which draws more current but also is able to operate with less headroom is preferred. FIG. 3 illustrates this second CMOS Schmitt trigger 60 in schematic form. Like Schmitt trigger 50, Schmitt trigger 60 includes two resistors 61 and 62 whose interconnection point provides a voltage $V_{IN}$ proportional to $V_{BATT}$. Schmitt trigger 60 also includes a P-channel transistor 63, an N-channel transistor 64, an inverter 65, and a P-channel transistor 66. Inverter 65 and transistor 66 function similarly to corresponding inverter 55 and transistor 56 of FIG. 2, respectively, and will not be further described. Transistor 63 has a source connected to $V_{BATT}$, a gate connected to $V_{SS}$, and a drain connected to the input terminal of inverter 65. Transistor 64 has a drain connected to the drain of transistor 63, a gate for receiving signal $V_{IN}$, and a source connected to $V_{SS}$. Since the gate of transistor 63 is connected to VSS rather than receiving signal $V_{IN}$, Schmitt trigger 60 avoids the headroom problems associated with Schmitt trigger 50, but at the cost of some DC current flow caused by transistor 63 being continuously conductive.

Figure 4:
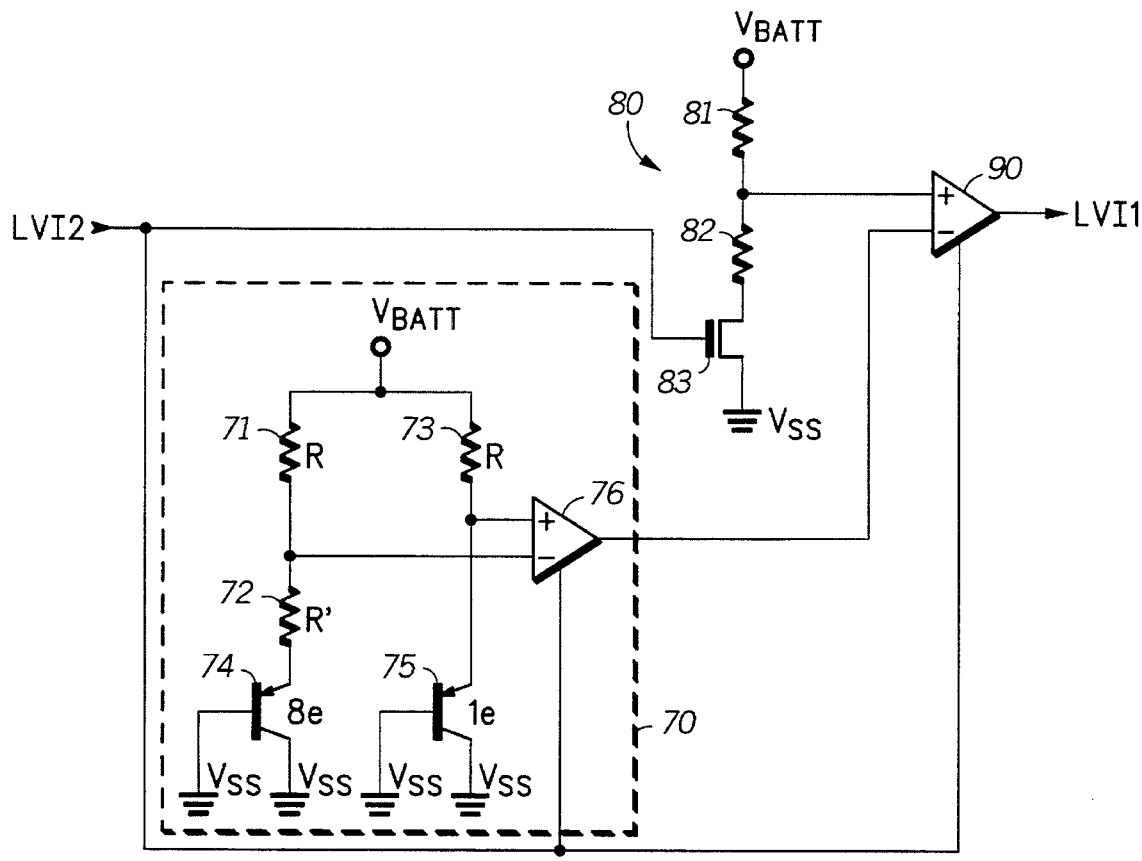
FIG. 4 illustrates in partial logic and partial schematic form the primary low voltage detection circuit of FIG. 1.

FIG. 4 illustrates in partial logic and partial schematic form primary low voltage inhibit (LVI) circuit 30 of FIG. 1. While many LVI circuit configurations would be apparent to those of ordinary skill in the art, primary LVI circuit 30 additionally includes an enable input terminal which allows it to be used in LVI circuit 20 of FIG. 1. Primary LVI circuit 30 includes generally a bandgap voltage reference circuit 70, a proportional voltage circuit 80, and an output comparator 90. Bandgap voltage reference circuit 70 includes resistors 71–73, PNP bipolar transistors 74 and 75, and an operational amplifier 76. Resistor 71 has a first terminal connected to $V_{BATT}$, and a second terminal. Resistor 72 has a first terminal connected to the second terminal of resistor 71, and a second terminal. Resistor 73 has a first terminal connected to $V_{BATT}$, and a second terminal. Transistor 74 has an emitter connected to the second terminal of resistor 72, and a base and a collector each connected to $V_{SS}$. Transistor 75 has an emitter connected to the second terminal of resistor 73, and a base and a collector each connected to $V_{SS}$. Operational amplifier 76 has a positive input terminal connected to the second terminal of resistor 73, a negative input terminal connected to the second terminal of resistor 71, an enable input terminal for receiving signal LVI2, and an output terminal. Resistors 71 and 73 each have equal resistances designated "R", whereas the value of resistor 72, designated "R'", depends on the manufacturing process. Transistor 74 has an emitter area labelled "8e", which is eight times the emitter area of transistor 75, labelled "1e". Bandgap voltage reference circuit 70 is very low power by the inclusion of an operational amplifier 76 which is selectively disabled. Otherwise, bandgap voltage reference circuit 70 functions as a conventional bandgap voltage reference circuit.

Proportional voltage circuit 80 includes resistors 81 and 82 and an N-channel transistor 83. Resistor 81 has a first terminal connected to $V_{BATT}$, and a second terminal. Resistor 82 has a first terminal connected to the second terminal of resistor 81, and a second terminal. Transistor 83 has a drain connected to the second terminal of resistor 82, a gate for receiving signal LVI2, and a source connected to $V_{SS}$. Proportional voltage circuit 80 generates a voltage which is proportional to $V_{BATT}$, but is disabled from drawing DC current when transistor 83 is made nonconductive by signal LVI2 being inactive. Comparator 90 has a positive input terminal connected to the second terminal of resistor 81, a negative input terminal connected to the output terminal of operational amplifier 76, an enable input terminal for receiving voltage LVI2, and an output terminal for providing voltage LVI1. The values of resistors 81 and 82 set the proportional voltage to equal the output of bandgap voltage reference circuit 70 when $V_{BATT}$ reaches its critical voltage, which when signal LVI2 is active causes comparator 90 to activate signal LVI1. In the illustrated embodiment, the critical voltage is about 1.8 volts.

Figure 5:
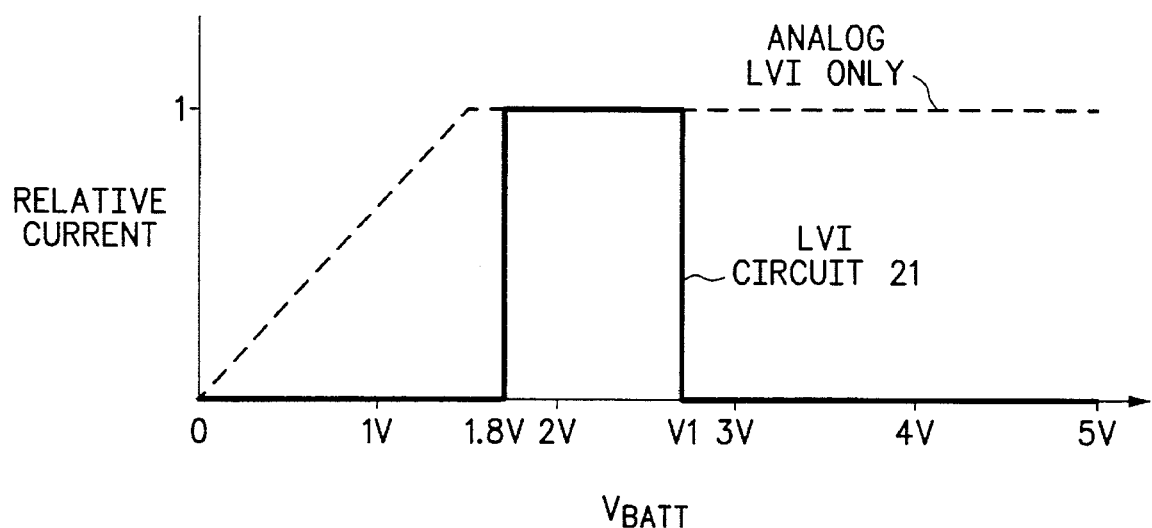
FIG. 5 illustrates a graph of the current required by the low voltage detection circuit of FIG. 1 as the power supply voltage varies.

FIG. 5 illustrates a graph of the relative current drawn by the low voltage detection circuit of FIG. 1 as the power supply voltage varies. In FIG. 5, the horizontal axis represents $V_{BATT}$, and the vertical axis represents relative total current consumption. The dashed line represents current consumption of known LVI circuits, i.e., ones which use an analog LVI circuit only. Down to approximately the critical voltage of about 1.8 volts, current consumption of these known LVI circuits is fixed. Conventional circuit design techniques such as increasing the values of the resistors lowers this level but at a substantial cost of circuit area. Below a certain voltage, current consumption compresses.

The solid line represents current consumption using LVI circuit 21. Above a critical range of voltage, between 1.8 volts and a voltage labelled V1, only secondary LVI circuit 35 is active, reducing current consumption to substantially zero. When $V_{BATT}$ falls below V1, secondary LVI circuit 35 activates signal LVI2, enabling primary LVI circuit 30. Only within this reduced range of voltage does LVI circuit 21 draw as much current as conventional LVI circuits. Below 1.8 volts, disabling circuit 40 again disables primary LVI circuit 30. Thus, the average current drain over the life of the battery is significantly reduced. Note that while the value of V1 controls when primary LVI circuit becomes active and thus affects average current consumption, it may vary somewhat without affecting the overall operation of LVI circuit 21.

While the invention has been described in the context of a preferred embodiment, it will be apparent to those skilled in the art that the present invention may be modified in numerous ways and may assume many embodiments other than that specifically set out and described above. For example, different primary and secondary LVI circuits may be used. The primary LVI circuit may be, for instance, a bandgap voltage reference circuit, a zener diode, or the like. Also many other transistor technologies besides CMOS are possible. While in the illustrated embodiment the internal circuit was a microcontroller, the invention is applicable to other types of circuits such as microprocessors, memories, peripherals such as timers, frequency synthesizers, and the like. Also in some embodiments it may be desirable to provide the RESET signal as an output signal from the integrated circuit for use by other circuits. Accordingly, it is intended by the appended claims to cover all modifications of the invention which fall within the true spirit and scope of the invention.

I claim:

1. A low voltage inhibit circuit comprising:

a primary low voltage inhibit circuit having a sense input terminal for receiving a power supply voltage, an enable input terminal, and an output terminal for providing a first low voltage inhibit output signal indicative of whether a voltage at said sense input terminal exceeds a first predetermined voltage, when an enable signal received at said enable input terminal is active; and a secondary low voltage inhibit circuit having a sense input terminal for receiving said power supply voltage, and an output terminal for providing a second low voltage inhibit output signal, said secondary low voltage inhibit circuit activating said second low voltage inhibit output signal to indicate that said power supply voltage is less than a second predetermined voltage;

said enable input terminal of said primary low voltage inhibit circuit is coupled to said output terminal of said secondary low voltage inhibit circuit such that said enable signal corresponds to said second low voltage inhibit output signal;

said second predetermined voltage exceeding said first predetermined voltage.

2. The low voltage inhibit circuit of claim 1 further comprising disabling means having an input coupled to said output terminal of said primary low voltage inhibit circuit, and an output coupled to said enable input terminal of said primary low voltage inhibit circuit, for disabling said primary low voltage inhibit circuit after said primary low voltage inhibit circuit activates said first low voltage inhibit output signal.

3. The low voltage inhibit circuit of claim 1 wherein said primary low voltage inhibit circuit is characterized as being an analog low voltage inhibit circuit.

4. The low voltage inhibit circuit of claim 3 wherein said primary low voltage inhibit circuit provides said first low voltage inhibit output signal using a bandgap voltage reference circuit.

5. The low voltage inhibit circuit of claim 1 wherein said secondary low voltage inhibit circuit comprises a Schmitt trigger having an input terminal coupled to said sense input terminal of said secondary low voltage inhibit circuit for receiving said power supply voltage, and an output terminal coupled to said output terminal of said secondary low voltage inhibit circuit, whereby said secondary low voltage inhibit circuit provides said second low voltage inhibit output signal in response to a voltage at said output terminal of said Schmitt trigger.

6. The low voltage inhibit circuit of claim 5 wherein said secondary low voltage inhibit circuit further comprises an inverter having an input terminal coupled to said output terminal of said Schmitt trigger, and an output terminal coupled to said output terminal of said secondary low voltage inhibit circuit for providing said second low voltage inhibit output signal.

7. The low voltage inhibit circuit of claim 6 further comprising a disabling circuit comprising:

an SR flip-flop having a set input terminal coupled to said output terminal of said primary low voltage inhibit circuit, a reset input terminal coupled to said output terminal of said Schmitt trigger, a true output terminal for providing a reset output signal, and a complementary output terminal; and an AND gate having a first input terminal coupled to said output terminal of said inverter, a second input terminal coupled to said complementary output terminal of said SR flip-flop, and an output terminal for providing said enable signal.

8. The low voltage inhibit circuit of claim 5 wherein said Schmitt trigger is characterized as being a CMOS Schmitt trigger.

9. The low voltage inhibit circuit of claim 1 wherein said power supply voltage is characterized as being a battery voltage.

10. An integrated circuit with a low voltage inhibit circuit comprising:

a primary low voltage inhibit circuit having a sense input terminal for receiving a first power supply voltage, an enable input terminal, and an output terminal for providing a first low voltage inhibit output signal indicative of whether a voltage at said sense input terminal exceeds a first predetermined voltage, when an enable signal received at said enable input terminal is active;

a secondary low voltage inhibit circuit having a sense input terminal for receiving said first power supply voltage, and an output terminal for providing a second low voltage inhibit output signal, said secondary low voltage inhibit circuit activating said second low voltage inhibit output signal to indicate that said first power supply voltage is less than a second predetermined voltage;

said enable input terminal of said primary low voltage inhibit circuit is coupled to said output terminal of said secondary low voltage inhibit circuit such that said enable signal corresponds to said second low voltage inhibit output signal;

said second predetermined voltage exceeding said first predetermined voltage; and an internal circuit having power supply voltage terminals for receiving said first power supply voltage and a second power supply voltage, and a reset input terminal coupled to said output terminal of said primary low voltage inhibit circuit.

11. The integrated circuit of claim 10 further comprising disabling means having an input coupled to said output terminal of said primary low voltage inhibit circuit and an output coupled to said enable input terminal of said primary low voltage inhibit circuit, for disabling said primary low voltage inhibit circuit after said primary low voltage inhibit circuit activates said first low voltage inhibit output signal.

12. The integrated circuit of claim 10 wherein said primary low voltage inhibit circuit is characterized as being an analog low voltage inhibit circuit.

13. The integrated circuit of claim 12 wherein said primary low voltage inhibit circuit provides said first low voltage inhibit output signal using a bandgap voltage reference circuit.

14. The integrated circuit of claim 10 wherein said secondary low voltage inhibit circuit comprises a Schmitt trigger having an input terminal coupled to said sense input terminal of said secondary low voltage inhibit circuit for receiving said first power supply voltage, and an output terminal coupled to said output terminal of said secondary low voltage inhibit circuit, whereby said secondary low voltage inhibit circuit provides said second low voltage inhibit output signal in response to a voltage at said output terminal of said Schmitt trigger.

15. The integrated circuit of claim 14 wherein said secondary low voltage inhibit circuit further comprises an inverter having an input terminal coupled to said output terminal of said Schmitt trigger, and an output terminal coupled to said output terminal of said secondary low voltage inhibit circuit for providing said second low voltage inhibit output signal.

16. The integrated circuit of claim 15 further comprising a disabling circuit comprising:

an SR flip-flop having a set input terminal coupled to said output terminal of said primary low voltage inhibit circuit, a reset input terminal coupled to said output terminal of said Schmitt trigger, a true output terminal for providing a reset output signal, and a complementary output terminal; and an AND gate having a first input terminal coupled to said output terminal of said inverter, a second input terminal coupled to said complementary output terminal of said SR flip-flop, and an output terminal for providing said enable signal.

17. The integrated circuit of claim 14 wherein said Schmitt trigger is characterized as being a CMOS Schmitt trigger.

18. The integrated circuit of claim 10 wherein said first power supply voltage is characterized as being a battery voltage.

* * * * *